United States Patent [19]
Clifton et al.

[11] Patent Number: 5,980,193
[45] Date of Patent: Nov. 9, 1999

[54] MAGNETICALLY LEVITATED ROBOT AND METHOD OF INCREASING LEVITATION FORCE

[75] Inventors: David B. Clifton, Leander; Joseph F. Pinkerton, Austin, both of Tex.

[73] Assignee: Magnetic Bearing Technologies, Inc., Austin, Tex.

[21] Appl. No.: 08/715,670

[22] Filed: Sep. 18, 1996

[51] Int. Cl.[6] .................................................. B25J 13/00
[52] U.S. Cl. .......................................... 414/749; 198/619
[58] Field of Search ........................... 414/749, 751–753; 198/619; 104/281, 282, 292

[56] References Cited

U.S. PATENT DOCUMENTS

| | | | |
|---|---|---|---|
| 4,624,617 | 11/1986 | Belna | 414/347 |
| 4,644,205 | 2/1987 | Sudo et al. | |
| 4,900,962 | 2/1990 | Hockney et al. | 104/281 X |
| 5,241,912 | 9/1993 | Oshima et al. | 104/282 |
| 5,284,411 | 2/1994 | Enomoto et al. | 414/217 |
| 5,288,199 | 2/1994 | Enomoto | 414/749 |
| 5,345,128 | 9/1994 | Pinkerton et al. | 310/90.5 |
| 5,639,206 | 6/1997 | Oda et al. | 198/619 X |
| 5,666,883 | 9/1997 | Kuznetsov | 104/281 X |
| 5,717,261 | 2/1998 | Tozoni | 104/282 X |

OTHER PUBLICATIONS

K.H. Park et al., "Contactless Magnetically Levitated Silicon Wafer Transport System," *Mechatronics*, vol. 6, No. 5, Aug. 1, 1996.

*Primary Examiner*—Donald W. Underwood
*Attorney, Agent, or Firm*—Fish & Neave; Robert W. Morris

[57] ABSTRACT

A magnetically levitated transport device provides levitation and propulsion of a vacuum carriage. An air carriage is moved by conventional means through both linear and angular displacements. Non-magnetic coils mounted on the air carriage interact with permanent magnets mounted on the vacuum carriage to magnetically link the carriages together using Lorentz forces. The non-magnetic coils, which are exposed to the fields generated by the permanent magnets, produce the Lorentz forces when driven by drive currents in response to inputs received from position sensors. In one embodiment, power requirements are reduced by adding permanent magnets to the air carriage that interact with some of the permanent magnets on the vacuum carriage to provide forces that substantially levitate all of the static load.

15 Claims, 14 Drawing Sheets

MAGNETICALLY LEVITATED ROBOT AND METHOD OF INCREASING LEVITATION FORCE

BACKGROUND OF THE INVENTION

This invention relates to magnetic levitation systems, and more particularly to using magnetic levitation in linear transport systems which transport materials between process stations in a vacuum environment.

The use of linear transport systems is well known throughout various industries. For example, many manufacturing operations utilize linear transport systems to move the materials being fabricated into and out of vacuum chambers, where the materials are treated. The use of magnetic levitation enables the transport mechanism to be substantially free of dust and other particulates. For example, Enomoto U.S. Pat. No. 5,288,199 describes a transporting device which uses a magnetically levitated floating arm to transport semiconductor wafers between multiple chambers of a wafer fabrication system. Enomoto relies on the use of proportional/integrating/differentiating (PID) control circuits to maintain the slider arm in the proper horizontal position and a judging circuit to determine whether a wafer is present on the arm.

In another system, Oshima et al. U.S. Pat. No. 5,241,912 describes a magnetically floating carrier in which electromagnets act through a reduced thickness portion of the wall of a lateral member. Oshima, like Enomoto is directed toward an apparatus for transporting semiconductor wafers in a vacuum chamber. Oshima utilizes a sealed tubular portion that is typically maintained at atmospheric pressure, while a carrier that slides along the tubular portion is disposed in the vacuum. A drive system is disposed within the tube that includes two pairs of magnetic bearings and various position sensors. The magnetic bearings interact with magnetic targets that are placed on the carrier to cause the carrier to laterally float back and forth. In order to reduce the power requirements of the system, Oshima discloses a technique whereby the thickness of certain portions of the outer wall of the tubular member (i.e., where the magnetic targets are placed) is reduced to improve the linkage between the bearings and the targets.

Another variation of a linear semiconductor transportation apparatus is disclosed by Belna U.S. Pat. No. 4,624,617. Belna's device utilizes a linear induction motor to levitate and linearly propel a car that supports a semiconductor wafer. The motor includes permanent magnets disposed on the car that interact with individually energizable electromagnets disposed along a track that the car travels along. The car is guided down the track by a pair of permanent magnet grooves (i.e., "V" shaped) in the underside of the car and pair of "V" shaped magnets that extend down from the track to the grooves. The electromagnets act to offset the natural magnetic forces between the grooves and the "V" shaped magnets such that the car levitates above the track. As the electromagnets are sequentially energized, the car moves linearly along the track.

While each of the above described devices may be adequate for transporting one or more semiconductor wafers, none of the devices are capable of transporting objects of greater weight, possibly even including cassettes holding multiple wafers. For example, Oshima describes how extra power would be necessary to transport single wafers without reducing the thickness of the tubular walls. The extra power, besides being a negative factor itself, may cause severe problems due to heat generation. In fact, the heat dissipation problem is particularly applicable in applications such as Belna in which the electromagnets may not be located in a region at atmospheric pressure.

In view of the foregoing, it is an object of this invention to provide improved magnetically levitated transport devices that operate with reduced power requirements.

It is also an object of this invention to provide improved magnetically levitated transport devices that are capable of transporting objects weighing more than a pound.

SUMMARY OF THE INVENTION

These and other objects of the invention are accomplished in accordance with the principles of the invention by providing magnetically levitated ("MAGLEV") transport devices that require significantly reduced power to levitate relatively heavy objects when compared to previously existing technologies. The MAGLEV devices of the present invention utilize permanent magnets to provide basic static levitation of the load with minimal power dissipation. Stability and linear acceleration of the levitated load is accomplished through the use of non-magnetic Lorentz force coils that provide fine-tuned control over both static levitation and movement of the load.

The combination of permanent magnets and the non-magnetic Lorentz force coils provides the capability to levitate and transport relatively large weight objects, such as liquid crystal flat-panel displays, between process stations. Additionally, a relatively large air-gap between the air-filled carriage and the carrier is possible as a result of the application of the permanent magnets and Lorentz force coils. The large air-gap and the sensor schemes of the present invention enable the devices disclosed herein to not only travel back and forth in a linear direction, but to also make vertical adjustments. The vertical adjustment capability enables the arm of the MAGLEV device to be lowered, slid under a load, and raised into position for lateral movement. Once the load has been delivered, the arm can once again be lowered for unloading the load.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
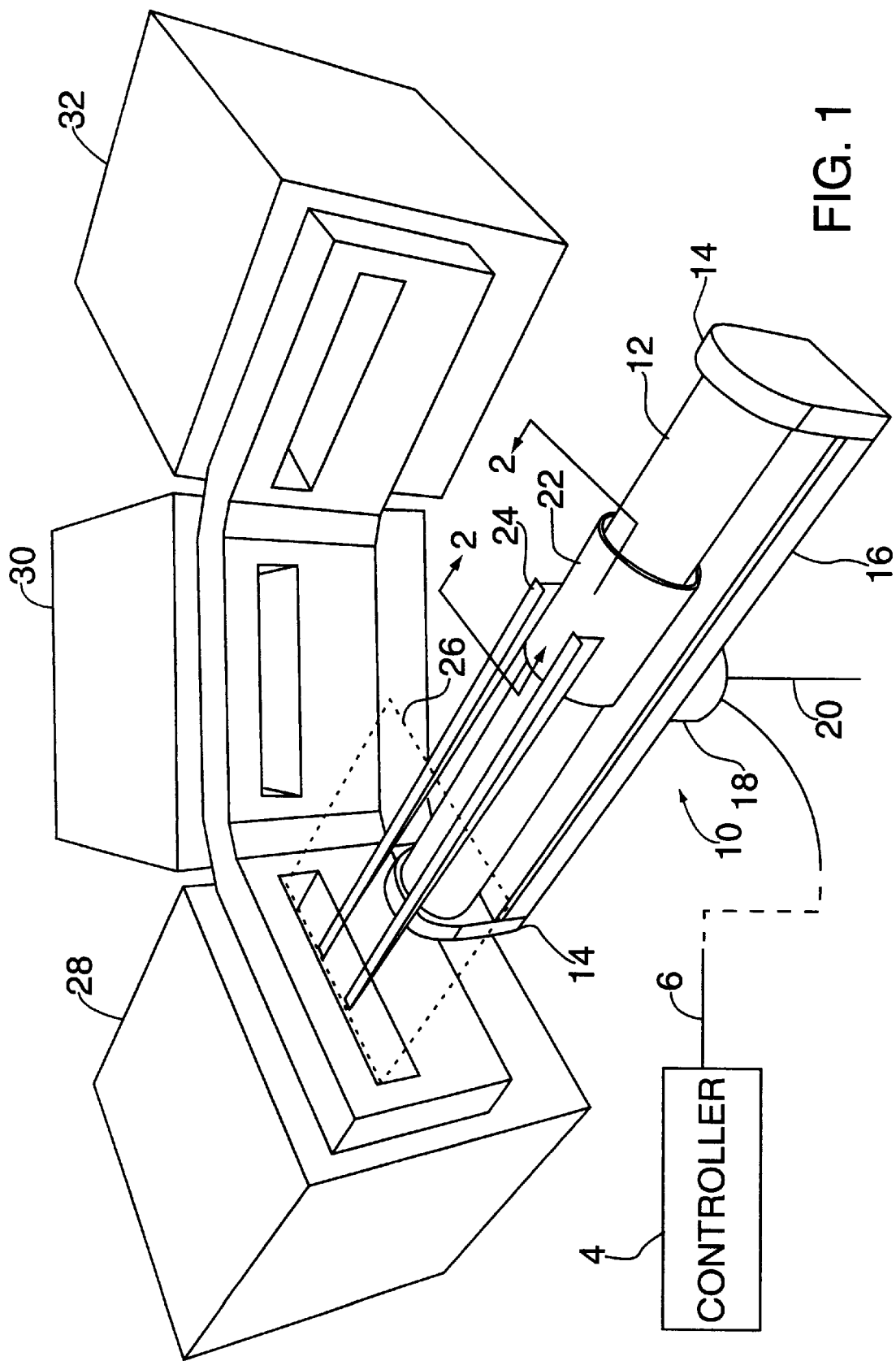
FIG. 1 is a three-dimensional perspective view of a magnetically levitated transport device constructed in accordance with principles of the present invention.

Referring to FIG. 1, a preferred embodiment of a magnetically levitated transport device 10 (i.e., MAGLEV robot 10) in accordance with the principles of the present invention is described. MAGLEV robot 10 includes a substantially cylindrical housing 12 that is sealed at both ends by bulkheads 14 such that the internal atmosphere of housing 12 may be preferably maintained at or about atmospheric pressure (MAGLEV robot 10 is intended for use in a vacuum chamber). Housing 12 may be formed from any non-magnetic material such as non-magnetic stainless steel or aluminum. Housing 12 (via a center pylon 40 shown in FIG. 2) and bulkheads 14 are mounted to a support 16 that may be rotated on pedestal 18 about axis 20. MAGLEV robot 10 also includes a controller 4 (connected to circuitry within housing 12, as described below, via a cable 6 that extends from pedestal 18) and a vacuum carriage 22 that is substantially cylindrical and mounted about housing 12.

During normal operations, carriage 22 is magnetically levitated and driven such that it moves laterally in both directions along the length of housing 12 without ever contacting housing 12. Extending from carriage 22 are a pair of arms 24 upon which the object being transported 26 (shown as a dashed line) is placed. Object 26 may be transported into and out of any of process stations 28, 30 and 32 (one or more stations in any sequence) by MAGLEV robot 10. In general, vacuum carriage 22 and arms 24 are moved such that the arms are lowered and then slid underneath object 26, at which point arms 24 are raised to slightly lift object 26. MAGLEV robot 10 is then rotated to the appropriate process chamber at which time vacuum carriage 22 is moved linearly until object 26 is inside the process chamber. Once inside the process chamber, arms 24 are gently lowered and removed, leaving object 26 in place for processing.

Figure 2:
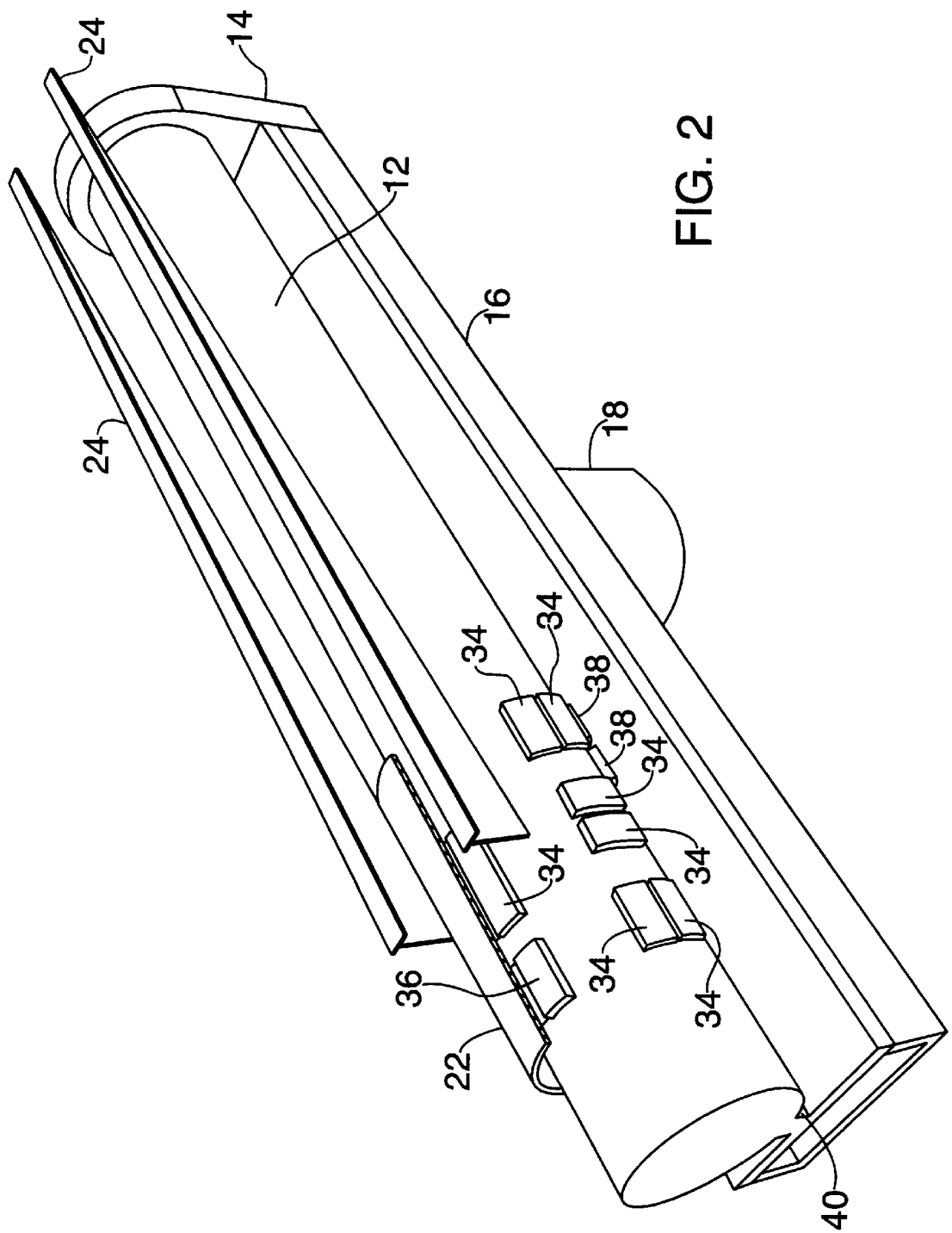
FIG. 2 is a three-dimensional perspective partial cutaway view of the vacuum carriage of the magnetically levitated transport device of FIG. 1, taken from line 2—2 of FIG. 1.

FIG. 2 shows a partial cutaway view of MAGLEV robot 10. In particular, FIG. 2 shows a cutaway view of vacuum carriage 22 that illustrates the placement of various permanent magnets that are fixed to the inner surface of carriage 22. The permanent magnets have varying functions, as is described in more detail below. Permanent magnets 34, generally, are used to produce magnetic fields that interact with non-magnetic Lorentz force coils located within cylindrical housing 12. (Each Lorentz coil is a non-magnetic coil that may be a unitary piece of solid electrically conductive material, but preferably, each Lorentz coil is made up of turns of wire consisting of a plurality of electrical conductors which are electrically insulated from each other and are electrically connected together in series. Unlike an electromagnet, Lorentz coils are not wound around or placed within an iron core.) Permanent magnets 36 and 38, on the other hand, are used to interact with permanent magnets located within cylindrical housing 12 (permanent magnets 36 are located at the rear of carriage 22, while permanent magnets 38, which are preferably placed in two pairs, each pair being offset by 25° to account for center pylon 40, are located in the front of carriage 22).

Figure 3:
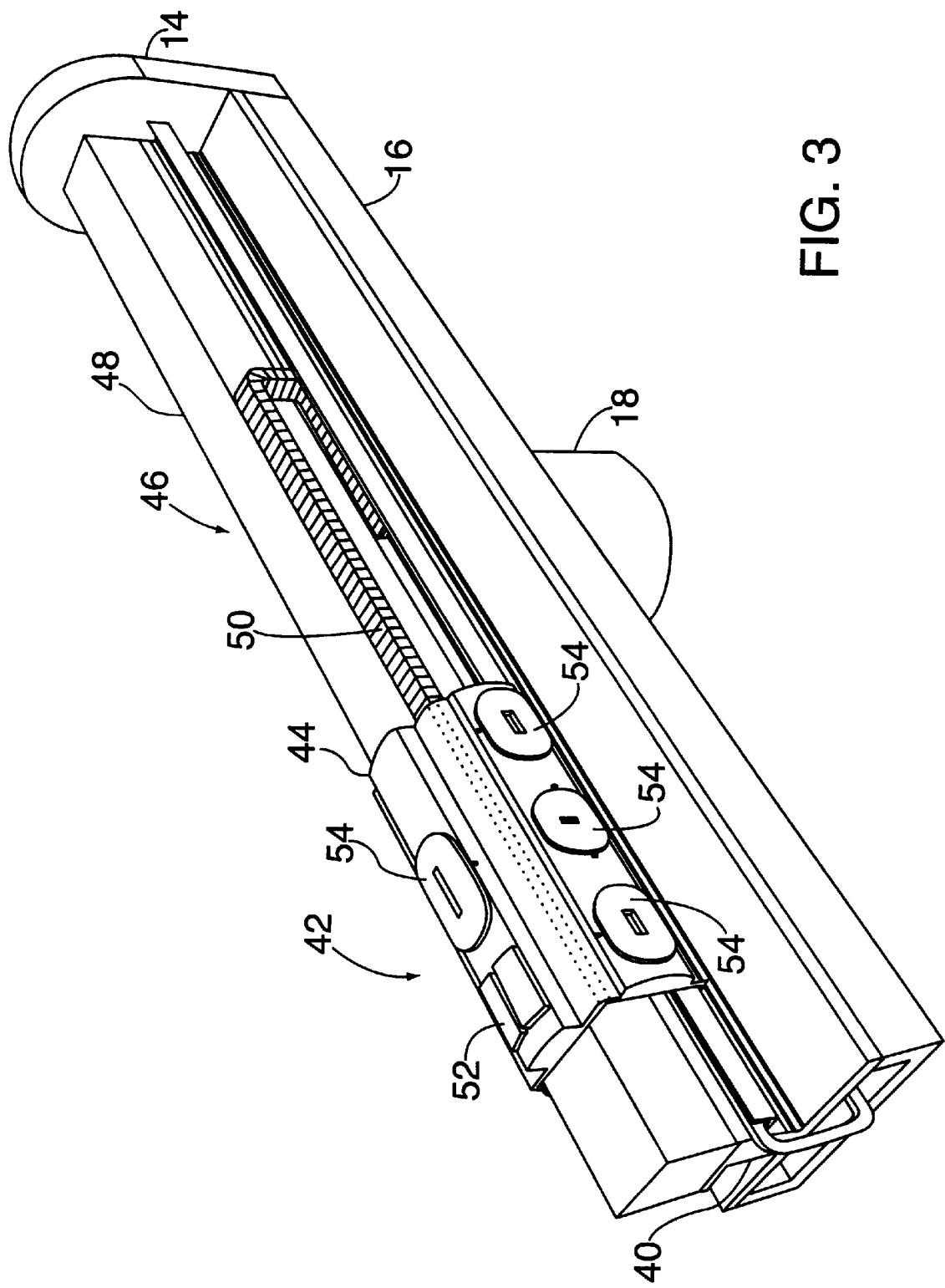
FIG. 3 is a three-dimensional perspective view of the air carriage of the magnetic drive system of the magnetically levitated transport device of FIG. 1.

FIG. 3 shows an exploded view of drive system 42 located within the housing 12. Drive system 42 includes an air carriage 44 that simply holds the various components of the drive system in place, and a linear table 46 that includes support 48, cable carrier 50 and a drive motor (not shown) (the drive motor is preferably a servo motor that provides increased reliability and highly controllable linear motion). Mounted on air carriage 44 are permanent magnets 52, which interact with upper permanent magnets 36 (two similar pairs of permanent magnets (not shown)), which are located underneath air carriage 44, interact with lower permanent magnets 38). Also mounted on air carriage 44 are Lorentz coils 54, which interact with permanent magnets 34.

Figure 4:
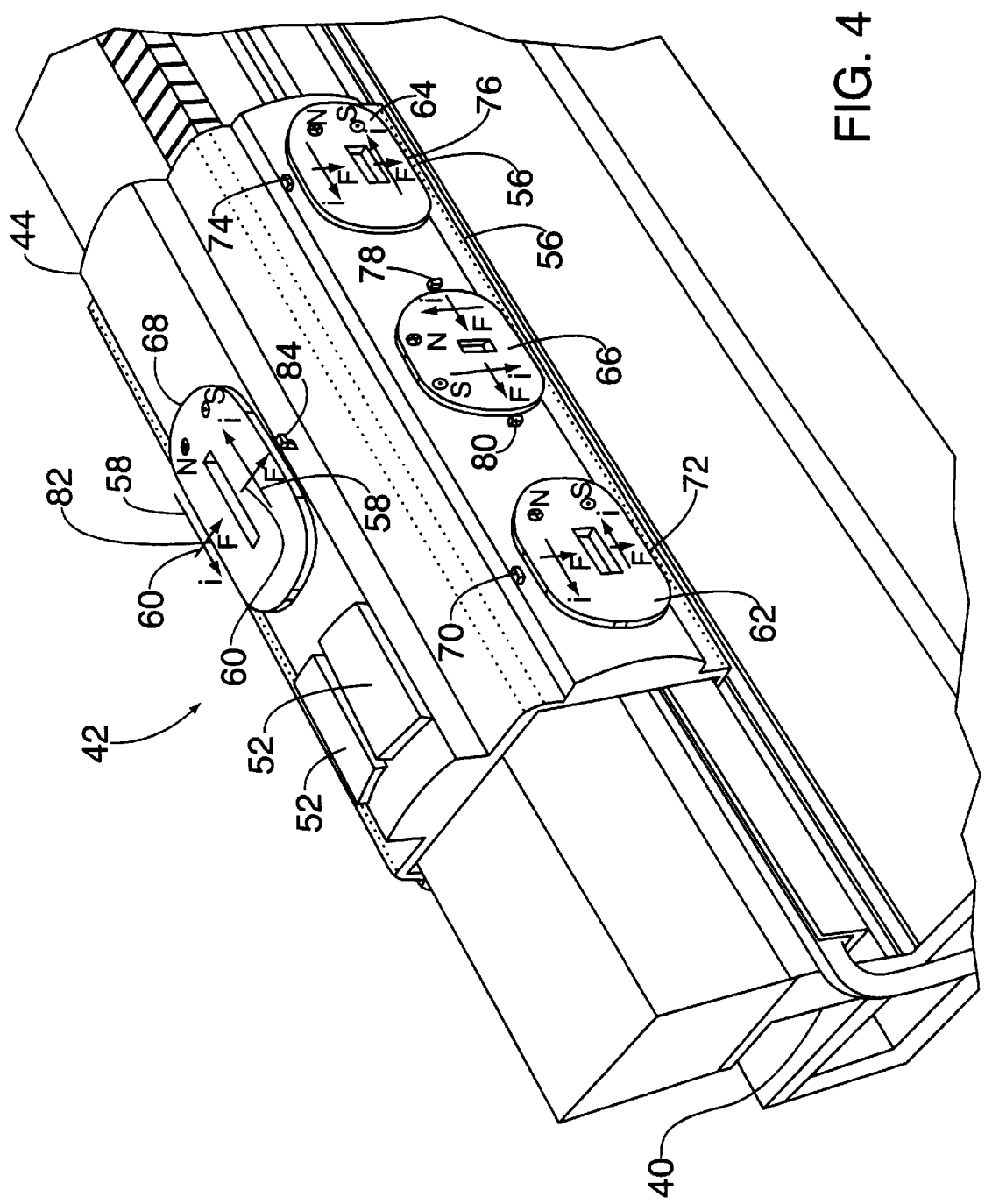
FIG. 4 is a three-dimensional perspective detailed view of the drive system of FIG. 3 that illustrates the effects of the Lorentz coils of the present invention.

A detailed view of drive system 42 is shown in FIG. 4. As described above, air carriage 44 includes upper permanent magnets 52 and lower permanent magnets 56 (lower magnets 56 interact with lower permanent magnets 38 of FIG. 2). The permanent magnets of air carriage 44 interact with the permanent magnets of vacuum carriage 22 to provide a substantial portion of the levitating force needed to levitate vacuum carriage 22 in both the loaded and unloaded conditions. In laboratory experiments, the permanent magnets, which were formed from neodymium-iron-boron magnets having a face area of approximately 1.5 in$^2$ with a gap of approximately 0.22 inches, were able to sustain leviation of an approximately 12 pound load placed on a carriage weighing approximately 40 pounds (including the weight of the arms).

Also attached to air carriage 44 are various Lorentz force coils (referred to generally in FIG. 3 as Lorentz coils 54). Permanent magnets 34 generate magnetic fields that penetrate the vacuum barrier formed by housing 12, and into Lorentz coils 54. When control currents are applied to the Lorentz coils (the control currents flow in a circular fashion around each Lorentz coil as indicated by, for example, arrows 58 in FIG. 4), a force is produced that acts perpendicular to both the current and permanent magnet field (for example, the current indicated by arrows 58 produced a force on air carriage 44 indicated by arrows 60 in FIG. 4). The force on the permanent magnets of vacuum carriage 22, however, is directly opposite to the force applied to air carriage 44. In MAGLEV robot 10, the Lorentz forces are used to provide precise control and stabilization of vacuum carriage 22 as it is levitated by permanent magnets 36 and 38. While the forces indicated by arrows 60 are in one direction, reversing the applied control current so that the current indicated by arrows 58 reverses also causes the forces to reverse. Thus, the movement and leviation of vacuum carriage 22 is precisely controlled by adjusting the polarity and intensity of the applied control current.

Lorentz coils 62 and 64, and two corresponding Lorentz coils located directly opposite coils 62 and 64 on the rear of air carriage 44, each combine with the appropriate permanent magnets to form transducers that convert electrical control signals into control forces, provide control over the vertical position, pitch and roll of vacuum carriage 22. Lorentz coil 66, and the corresponding coil located directly opposite coil 66 on the back of air carriage 44, is also combined with a corresponding permanent magnet mounted to vacuum carriage 22 to form a transducer that provides longitudinal position and acceleration control. Lateral motion of vacuum carriage 22 is controlled by Lorentz coil 68 and its corresponding permanent magnet.

The application of control currents to the Lorentz transducers is based on inputs received from position sensors located at various locations adjacent to each Lorentz coil on air carriage 44. The position sensor for each Lorentz coil includes the two permanent magnets (i.e., one pair of magnets 34) associated with that coil and a pair of Hall effect magnetic field sensors that are used to measure the flux density produced by the permanent magnets. The two sensors are located on either side of the Lorentz coil in alignment with the Lorentz force vector produced by that coil. For example, the position of Lorentz coil 62 is monitored by Hall effect sensors 70 and 72 and the pair of permanent magnets 34 located on vacuum carriage 22 directly above coil 62 (it should be apparent that vacuum carriage 22 and air carriage 44 are maintained in substantial alignment with each other so that, for example, permanent magnets 36 are always in line with, and located above, permanent magnets 52).

Each Lorentz coil, including the three Lorentz coils directly opposite coils 62, 64 and 66, has a corresponding pair of Hall effect sensors that interact with the appropriate permanent magnet to act as a position sensor for that coil. Thus, the relative position of coil 64 is measured by sensors 74 and 76; the relative position of coil 66 is measured by sensors 78 and 80; and the relative position of coil 68 is measured sensors 82 and 84.

Figure 5:
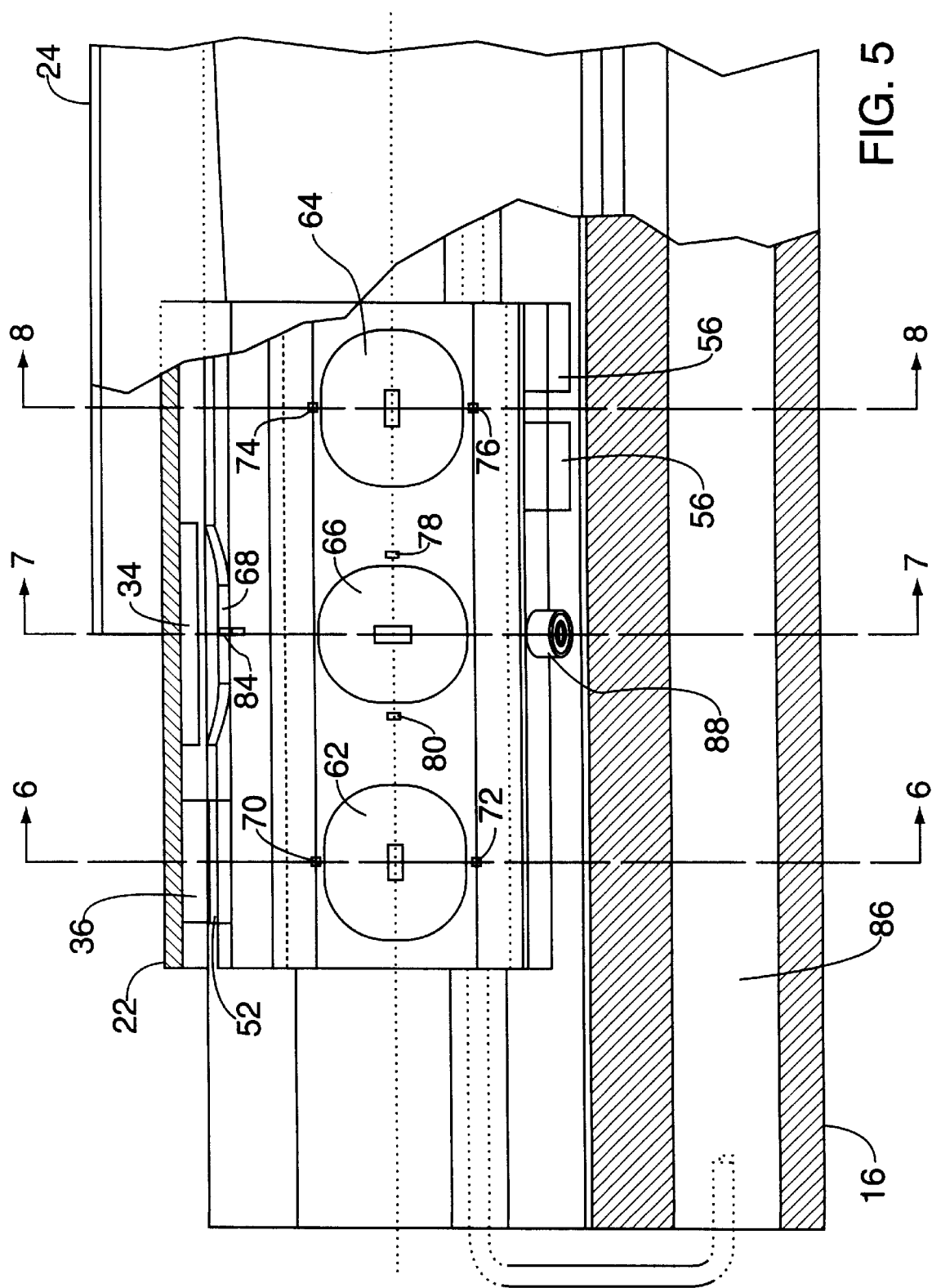
FIG. 5 is a partial cross-sectional view of the magnetic drive system of the magnetically levitated transport device of FIG. 1.

FIG. 5 is a partial cross-sectional plan view of MAGLEV robot 10. In particular, FIG. 5 is used to illustrate a unique power transfer feature of the present invention and to set forth three cutaway views that further detail a preferred embodiment of the present invention. Various features of the present invention shown in FIGS. 1–4 are also shown in FIG. 5. Additionally, FIG. 5 shows that support 16 includes a plenum 86 that carries cables and may also be used to supply cooling air to the air carriage, and also shows a coil 88 that forms the primary winding of a high-frequency transformer that may be used to provide power to the vacuum carriage in accordance with the principles of the present invention (coil 88 is preferably constructed as a coil embedded in a ferrite cup).

Figure 6:
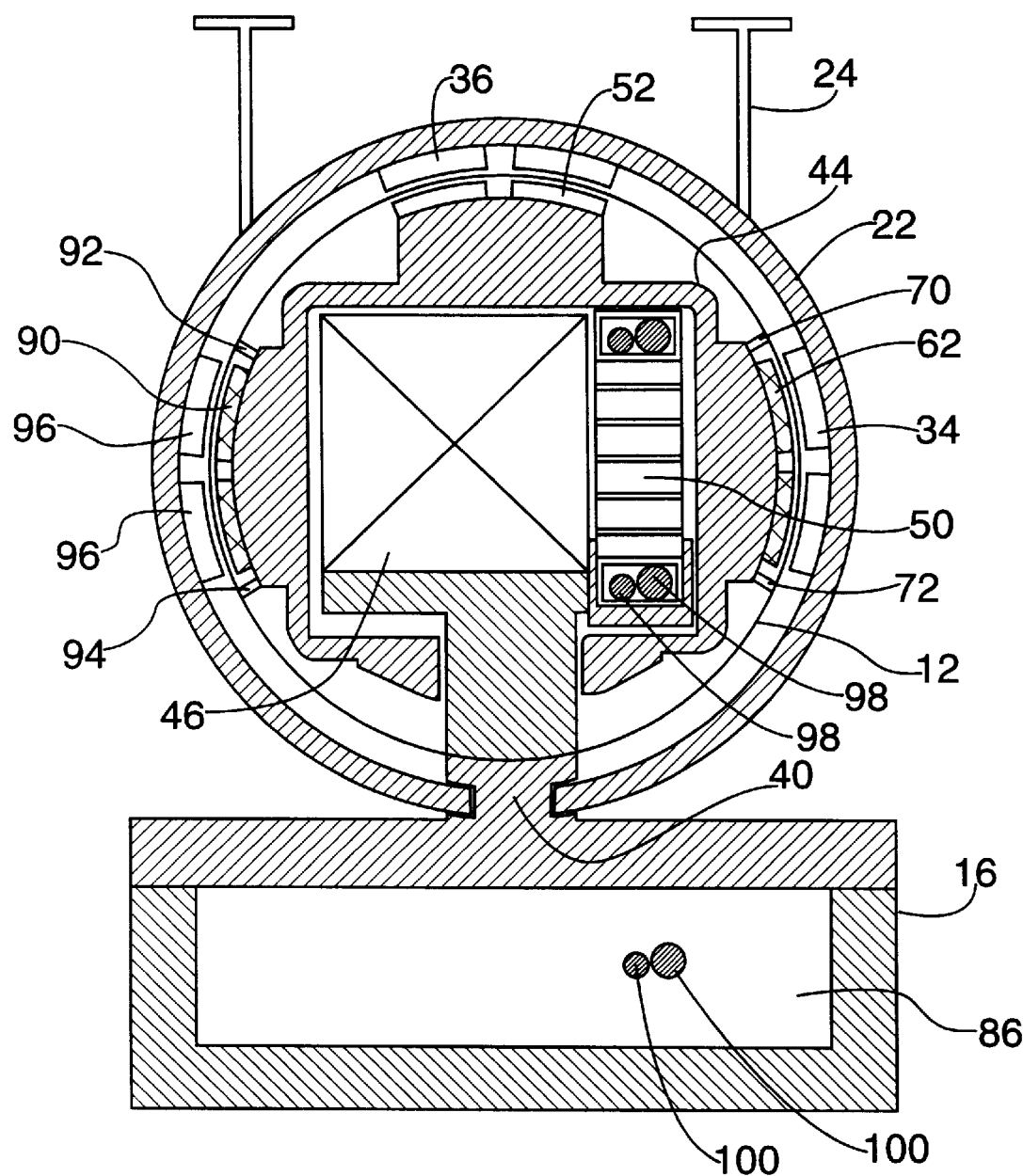
FIG. 6 is a cross-sectional view of the magnetically levitated transport device of FIG. 1, taken from line 6—6 of FIG. 5.

FIG. 6 shows a cross-section view of MAGLEV robot 10 taken along line 6—6 of FIG. 5. FIG. 6 shows the lateral configuration of many of the components shown in the previous figures. Also shown in FIG. 6 is Lorentz coil 90 (i.e., the Lorentz coil located opposite Lorentz coil 62, but not shown in FIG. 5), Hall effect sensors 92 and 94, and permanent magnets 96 (Lorentz coil 90 and permanent magnets 96 form a transducer as described above, the relative position of which is monitored by sensors 92 and 94 in combination with permanent magnets 96). Sample cables 98 and 100 are shown, respectively, within cable carrier 50 and within plenum 86. Linear table 46, as described above, is a conventional device that drives air carriage 44 back and forth along an axis parallel to the longitudinal length of support 16 (e.g., linear table 46 may simply be a Hauser HLE80, purchased from Hauser of Germany). FIG. 6 also shows that pedestal 40 is configured to provide additional safety in that pedestal 40 may act as a mechanical bearing in the unlikely event that a failure of the magnetic levitation system occurs.

Figure 7:
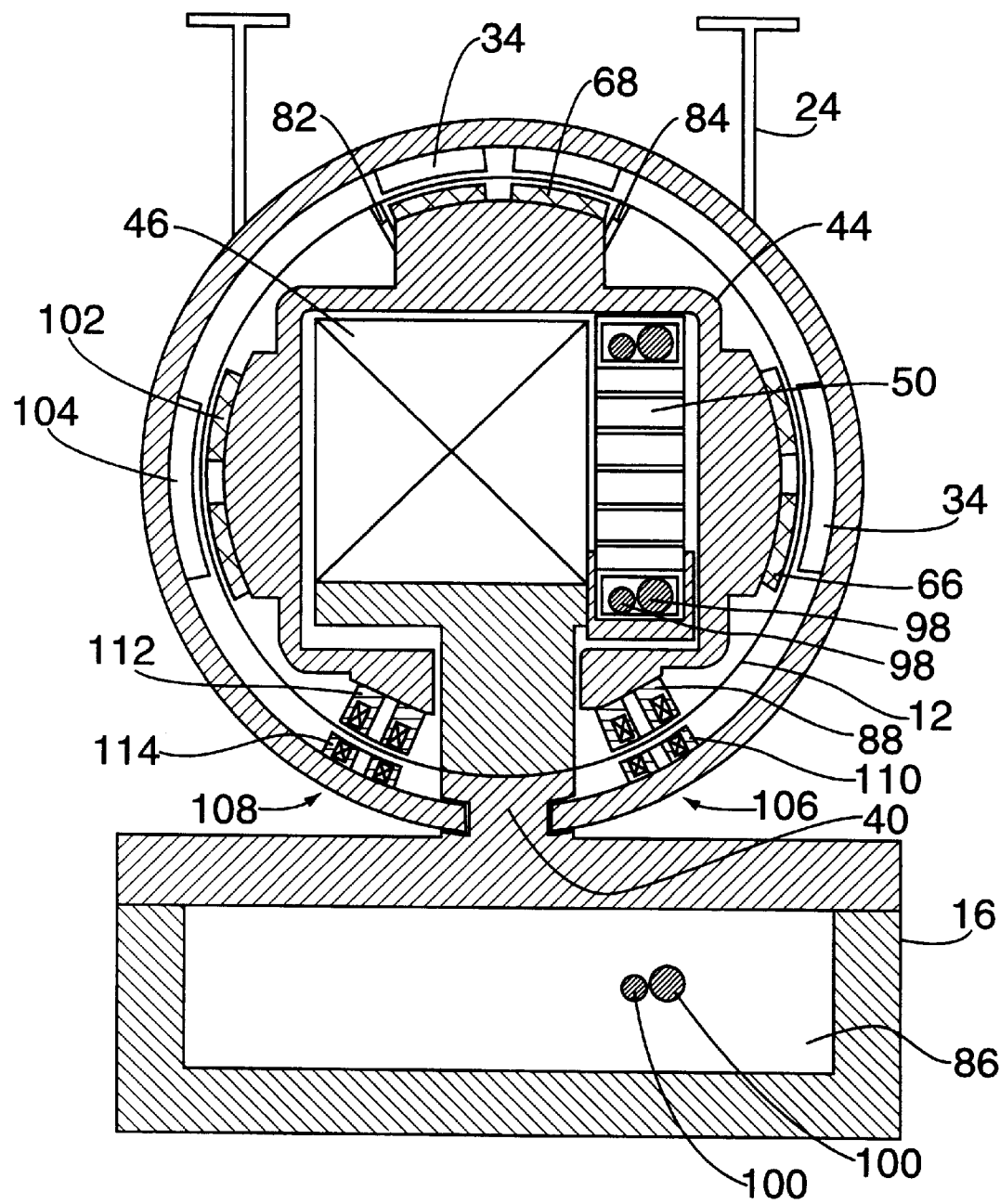
FIG. 7 is a cross-sectional view of the magnetically levitated transport device of FIG. 1, taken from line 7—7 of FIG. 5.

FIG. 7 shows a cross-section view of MAGLEV robot 10 taken along line 7—7 of FIG. 5. FIG. 7 also shows the lateral configuration of many of the components shown in the previous figures (including FIG. 6). Also shown in FIG. 7 is Lorentz coil 102 (i.e., the Lorentz coil located opposite coil 66, but not shown in FIG. 5) and permanent magnets 104 (Lorentz coil 102 and permanent magnets 104 form a transducer as described above, the relative position of which is monitored by Hall effect sensors (not shown) in combination with permanent magnets 104).

Additionally, in accordance with the principles of the present invention, a pair of transformers 106 and 108 are also shown in FIG. 7. Transformer 106 is formed by primary winding 88 (shown in FIG. 5) and secondary winding 110, which is connected to the interior surface of vacuum carriage 22 in a similar manner as permanent magnets 34, 36 and 38. Transformer 108 is formed by primary winding 112 (attached to air carriage 44 in the same manner as primary winding 88) and secondary winding 114, which is connected to the interior surface of vacuum carriage 22 in the same manner as secondary winding 110. Transformers 106 and 108 may be operated independently, or they may be coupled together to provide one or two sources of power to vacuum carriage 22. As shown, transformers 106 and 108 provide power from the air carriage to the vacuum carriage across the air barrier without a direct connection, thus, maintaining the integrity of the air chamber within housing 12. Power may be drawn from the secondary windings to, for example, energize an electrostatic clamp that holds panel 26 in place during motion of vacuum carriage 22.

Figure 8:
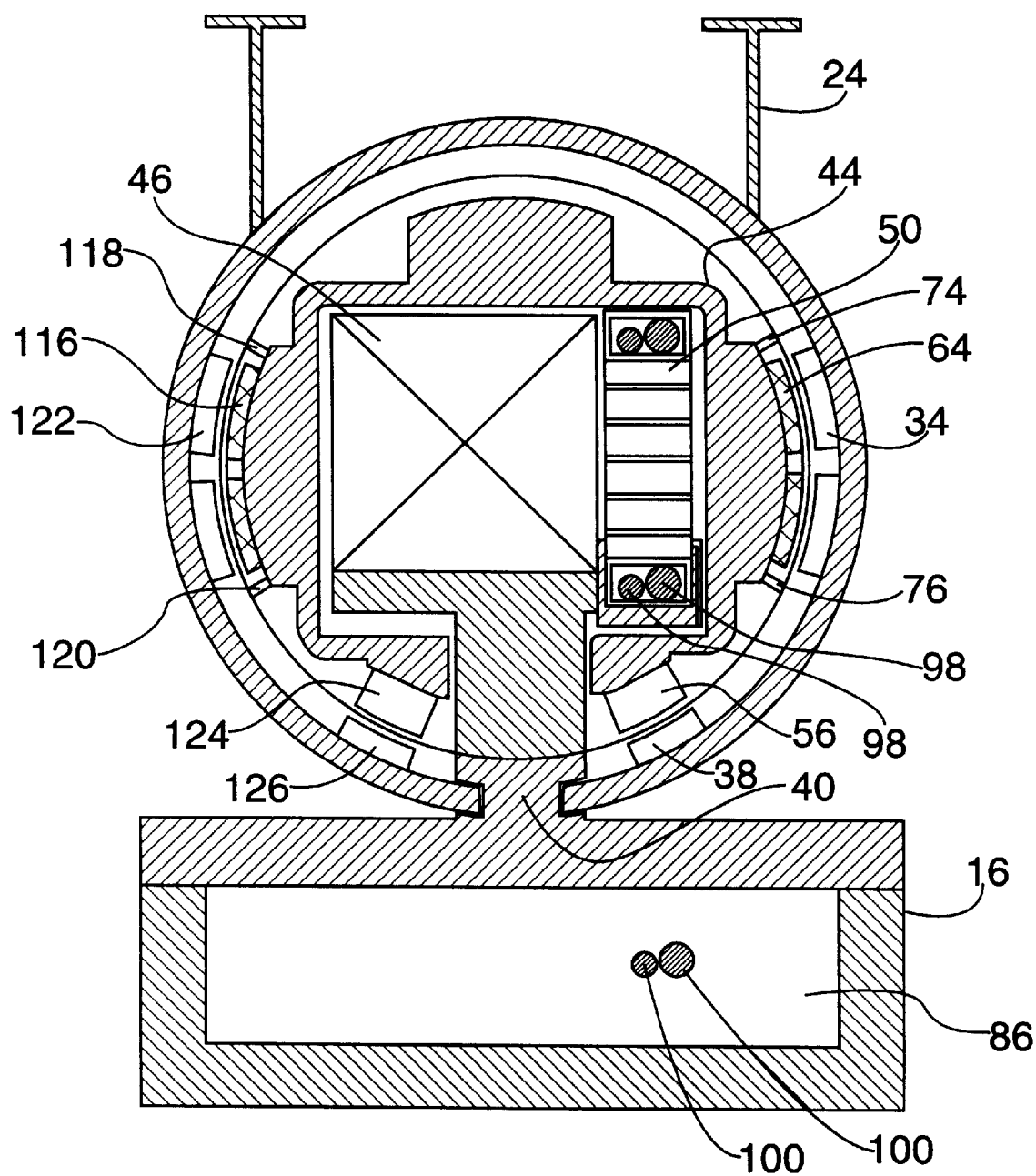
FIG. 8 is a cross-sectional view of the magnetically levitated transport device of FIG. 1, taken from line 8—8 of FIG. 5.

FIG. 8 shows a cross-section view of MAGLEV robot 10 taken along line 8—8 of FIG. 5. FIG. 8 shows the lateral configuration of many of the components shown in the previous figures (including FIGS. 6 and 7). Also shown in FIG. 8 is Lorentz coil 116 (i.e., the Lorentz coil located opposite Lorentz coil 64, but not shown in FIG. 5), Hall effect sensors 118 and 120, and permanent magnets 122 (Lorentz coil 116 and permanent magnets 122 form a transducer as described above, the relative position of which is monitored by sensors 118 and 120 in combination with permanent magnets 122). FIG. 8 also shows the configuration of the forward pair of permanent magnets 38 (of vacuum carriage 22) and 56 (of air carriage 44), as well as the configuration of permanent magnets 124 and 126 (which are not shown in the previous figures). As shown, permanent magnets 38, 56, 124 and 126 are offset from the central axis by approximately 25° due to pylon 40, which results in a slight reduction in their effective force (i.e., the magnets are only effective to cosine of 25°, or 91 percent of their maximum capacity).

MAGLEV robot 10 operates in accordance with the principles of the present invention as follows. Once the robot 10 has been powered up, permanent magnets 36, 38, 52, 56, 124 and 126 provide substantially all of the force necessary to levitate vacuum carriage 22 about air carriage 44 under steady state conditions (i.e., near-zero power consumption). Normal variations in stability appear as slight changes in the magnetic fields produced by the permanent magnets. These changes are detected by the Hall effect sensors located near each Lorentz coil, whereby the output of one sensor is subtracted from the output of the other sensor so that a non-zero value (outside of a predetermined tolerance) indicates that correction is required.

Corrections are provided to MAGLEV robot 10 as control currents that are applied to the appropriate Lorentz coil(s) in accordance with commands from controller 4. The control currents, as described above, interact with the magnetic fields produced by the permanent magnets to produce Lorentz forces that effectively push the air carriage and vacuum carriage back into proper alignment (i.e., levitation with essentially zero variations in stability for a given moment in time). The amplitude and polarity of control current varies based on inputs from the appropriate position sensor(s).

The application of power to maintain levitation is reduced in accordance with the principles of the present invention by the ability of MAGLEV robot 10 to adapt its operating conditions once loaded down. This capability exists because of circuitry that accounts for the relatively large air gap between the vacuum carriage and housing 12 that is necessary to enable arms 24 to be lowered and raised. Once MAGLEV robot 10 is positioned so that the load is above the end of arms 24, electronic controller 4 selects new position setpoints and temporarily drives currents in coils 62, 64, 90 and 116 (coils 90 and 116 are on the opposite side of coils 62 and 64, as shown in FIGS. 6 and 8) so that arms 24 contact and lift the load. The air gaps between permanent magnets 36 and 52, 38 and 56, and 124 and 126 have now been changed (in this case reduced) to new values such that the permanent magnets now produce an optimal force that maintains steady-state levitation of the load with a minimum amount of control current.

When arms 24 are in their lowered position, linear table 46 can be activated to move air carriage 44 toward panel 26. As air carriage 44 moves, the relationship between air carriage 44 and vacuum carriage 22 (i.e., the permanent magnets and the Lorentz coils that are producing Lorentz forces) causes vacuum carriage 22 and arms 24 to move as well. The control currents applied to the Lorentz coils also vary during these operations to provide smooth acceleration and deceleration of vacuum carriage 22. Thus, the air and vacuum carriages are magnetically "linked" through the use of Lorentz forces.

When arms 24 are in place under panel 26, and the control currents are again varied to cause arms 24 to be raised such that panel 26 is lifted off of its resting place, optional circuitry used to control an optional electrostatic clamp (not shown) within vacuum carriage 22 may be activated, via transformers 106 and 108, to lock panel 26 in place. Linear table 46 is again activated to withdraw panel 26 to a neutral position toward central pedestal 18. Pedestal 18 is then rotated to bring panel 26 into alignment with the proper one of process chambers 28, 30 or 32, at which point linear table 46 is again activated. Panel 26 is thus moved into the appropriate process chamber, arms 24 are lowered (and the "lock" on panel 26 is deactivated) and removed. During periods of movement, the application of control currents to the Lorentz coils maintains proper alignment and levitation of vacuum carriage 22 through the use of Lorentz forces.

FIGS. 9–14 show an alternative embodiment of the magnetically levitated transport device of FIG. 1, in which an alternate sensor scheme is utilized to provide the position information used to control the currents required to maintain MAGLEV robot 10 in a stable and aligned state. For convenience, only components related to the alternate sensor scheme are numbered differently than the references numerals used in FIGS. 1–8 (e.g., the arms are referred to as arms 24 in all of the figures). However, because a different sensor scheme is used, the vacuum carriage is referred to as vacuum carriage 222 in FIGS. 9–14 and the air carriage is referred to as air carriage 444. The discussion that follows applies to the newly referenced components of alternate MAGLEV robot 10 (for a discussion of the other numbered components shown in FIGS. 9–14, see the text above that corresponds to FIGS. 1–8).

Figure 9:
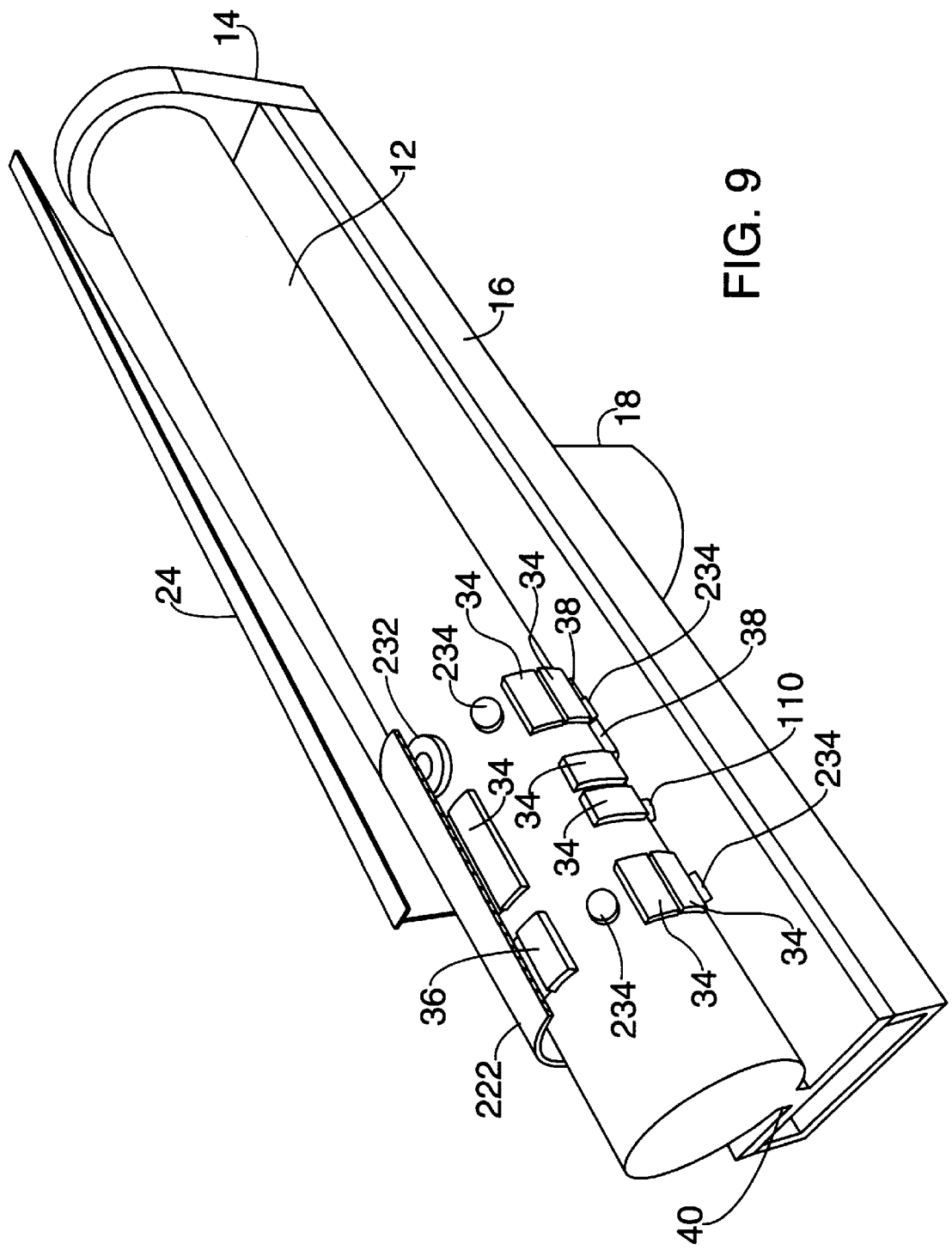
FIG. 9 is a three-dimensional perspective partial cutaway view of an alternative vacuum carriage of the magnetically levitated transport device of FIG. 1, taken from line 2—2 of FIG. 1, in which an alternative sensor scheme is utilized in accordance with principles of the present invention.

FIG. 9 shows several additional components related to the alternative position sensor scheme of FIGS. 9–14. In particular, FIG. 9 shows several components that are attached to the inner surface of vacuum carriage 222. Ferrite cup 232 is located on vacuum carriage 222 such that it is in alignment with a null-flux sensor (shown and described in detail with respect to FIG. 10). Additionally, eight ferromagnetic (or conductive) targets 234 (only four of which are visible in FIG. 9) are located such that each target is aligned with a conventional position sensor (shown in FIG. 10) located on the surface of air carriage 444 (see FIG. 10).

Figure 10:
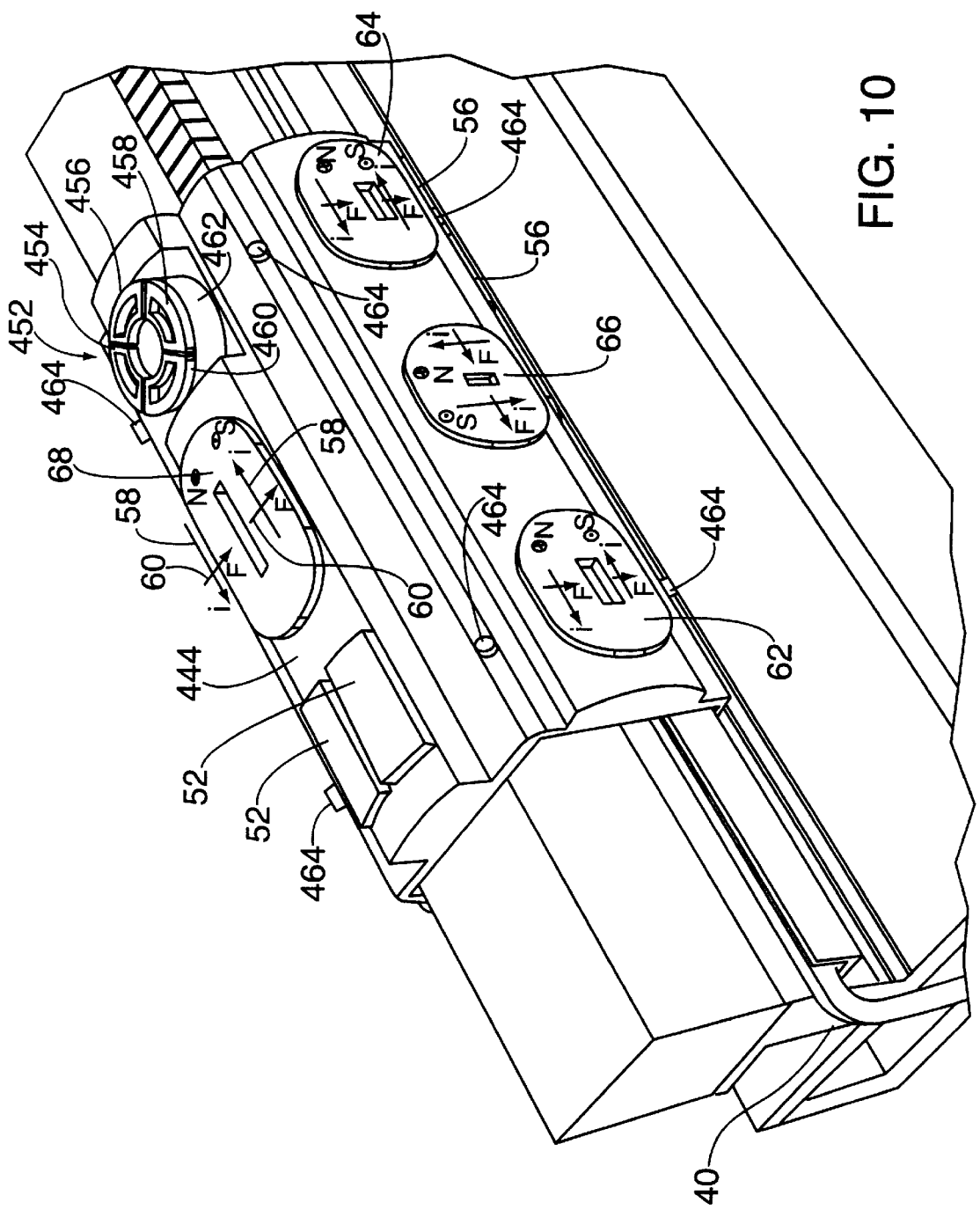
FIG. 10 is a three-dimensional perspective detailed view of an alternative drive system of the magnetically levitated transport device of FIG. 1 that further shows the alternative sensor scheme of FIG. 9.

FIG. 10 shows several additional components that are also related to the alternative position sensor scheme of FIGS. 9–14. In particular, FIG. 10 shows null-flux sensor 452 connected to the upper surface of air carriage 444 (located forward of, and on the same surface of carriage 444 as, Lorentz coil 68). Null-flux sensor 452 includes four sense coils 454, 456, 458 and 460 fixed to the top of a ferrite cup 462. The four sense coils 454–460 interact with ferrite cup 232 such that AC signals are induced in one or more of the coils whenever there is relative motion between ferrite cup 232 and sensor 452. Increases in the relative motion cause similar increases in the magnitude of the AC signals induced in the appropriate coils. Also shown in FIG. 10 are six conventional position sensors 464 (two additional conventional sensors are located on the corner of carriage 444 that is not viewable in FIG. 10) that provide carriage displacement information as described below. Only four of the eight sensors are actually needed to provide displacement information for two axes (i.e., transverse and vertical measurements of the carriage), pitch and yaw, but an additional set is provided for redundancy and improved reliability.

Figure 11:
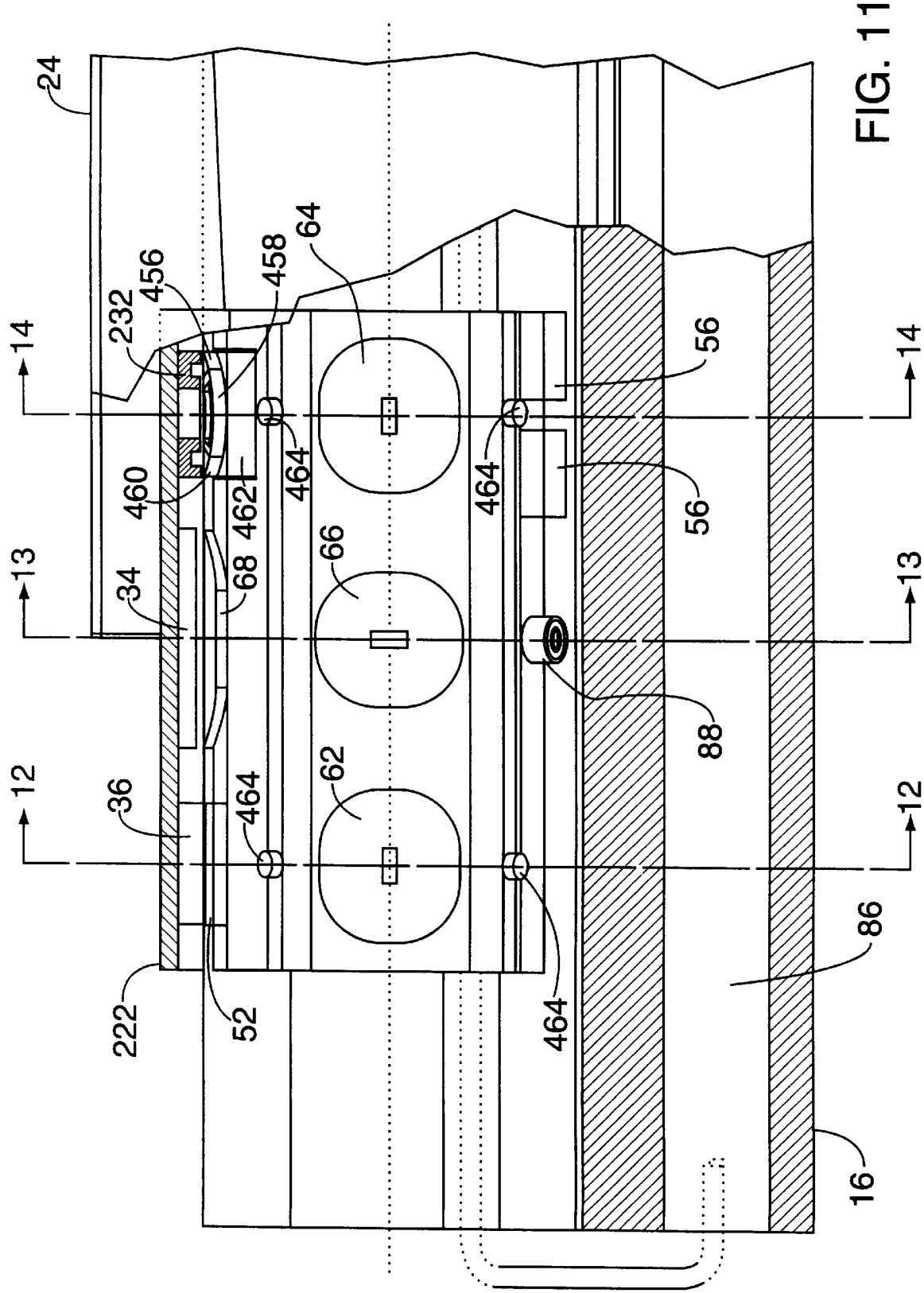
FIG. 11 is a partial cross-sectional view of the alternative position sensor configuration of the magnetically levitated transport device of FIGS. 9 and 10.
Figure 12:
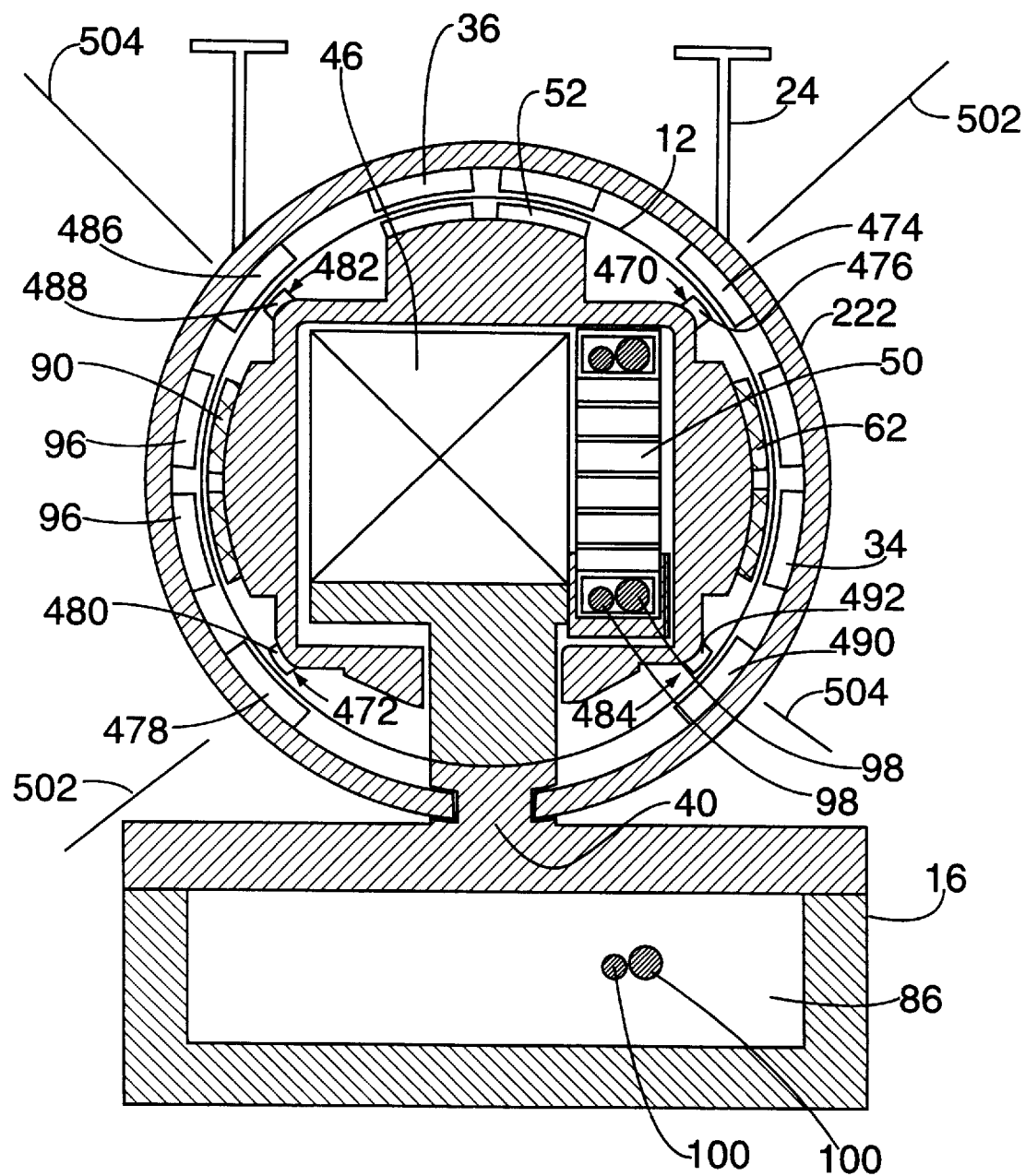
FIG. 12 is a cross-sectional view of the alternate magnetically levitated transport device of FIGS. 9 and 10, taken from line 12—12 of FIG. 11.
Figure 13:
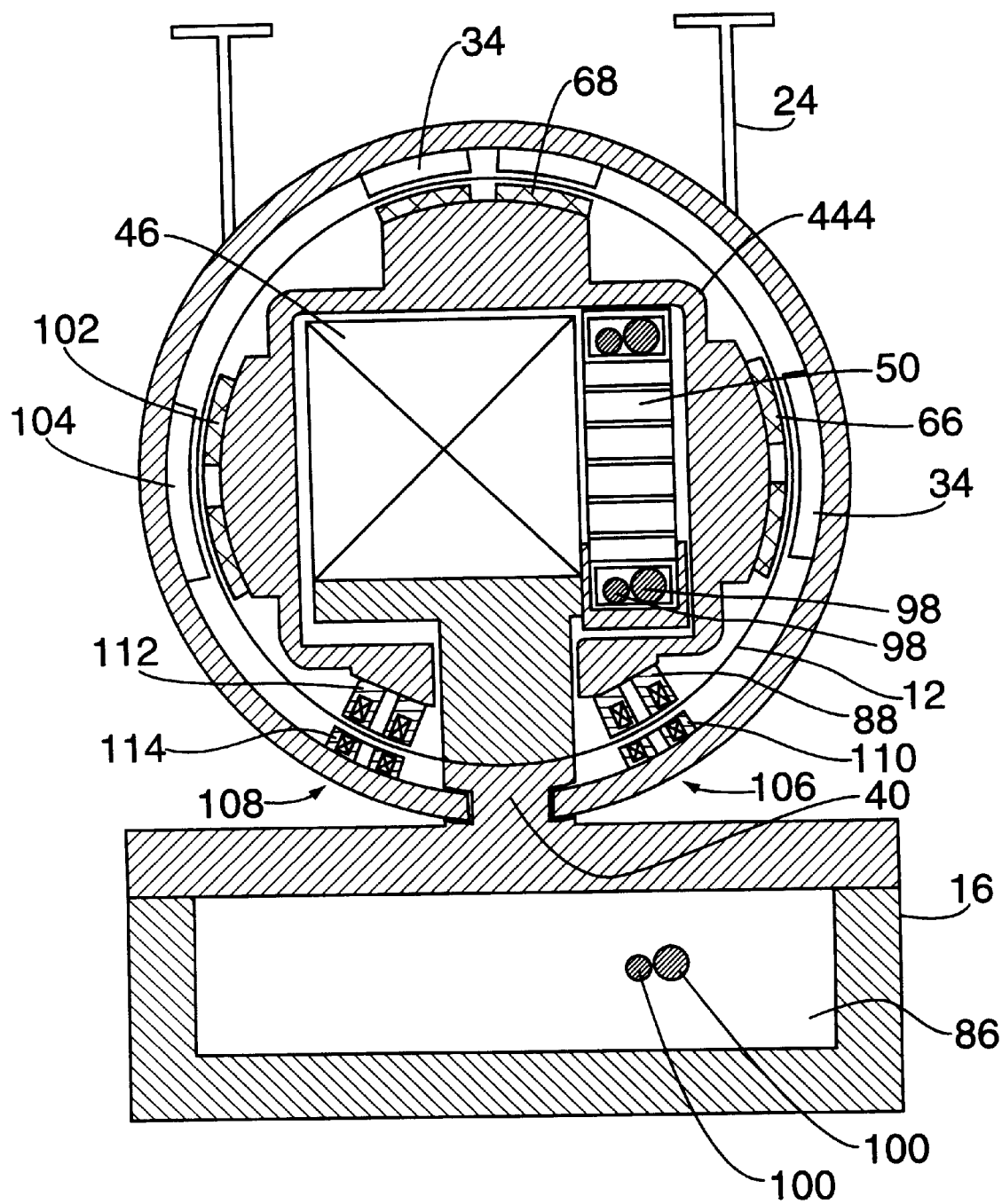
FIG. 13 is a cross-sectional view of the alternate magnetically levitated transport device of FIGS. 9 and 10, taken from line 13—13 of FIG. 11.

FIGS. 11 and 13 show different views of components that have been discussed above. FIG. 12, in particular, shows four of the conventional position sensors. In discussing the operation of the sensors, each sensor component is renumbered from the general reference numerals 234 (from FIG. 9) and 464 (from FIGS. 10 and 11) that were used previously. The first pair of sensors 470 and 472 provide displacement measurements along axis 502 (either sensor may be considered the "primary" sensor, while the other sensor provides backup information for the same axis). sensor 470 is formed from target 474 and conventional sensor 476 (which may be an eddy-current sensor, inductive sensor, or any other similar sensor). For example, if inductive sensors are used, sensor 476 is then a coil coupled to an AC circuit that measures inductance. As the distance between the coil and target 474 varies, the inductance changes. Sensor 472 is similarly formed from target 478 and conventional sensor 480.

Figure 14:
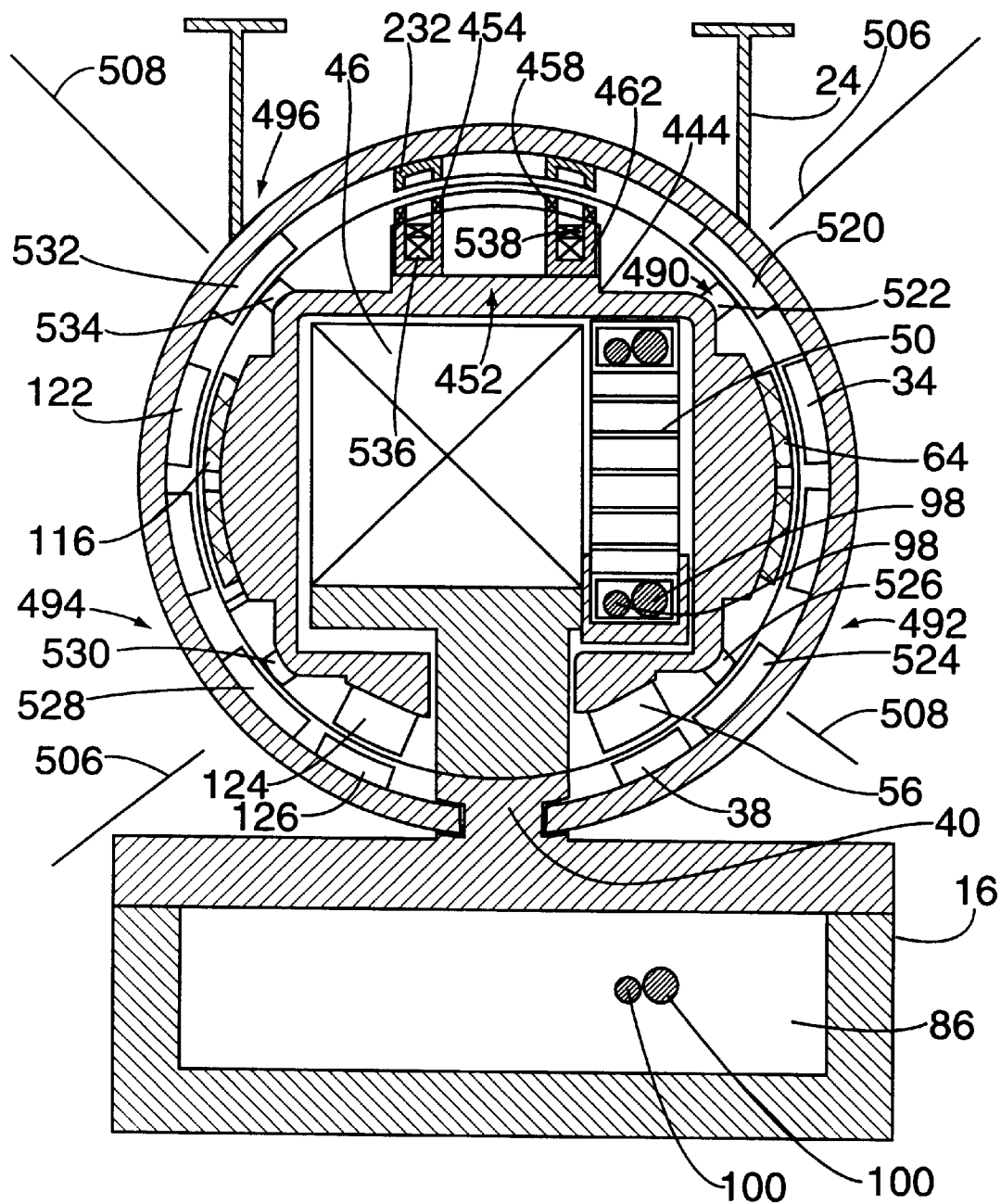
FIG. 14 is a cross-sectional view of the alternate magnetically levitated transport device of FIGS. 9 and 10, taken from line 14—14 of FIG. 11.

Displacement measurements along a second axis 504 are made by a second pair of sensors 482 and 484. Once again, one of sensors 482 and 484 is the "primary" sensor, while the other sensor is the backup. Sensor 482 is formed from target 486 and conventional sensor 488, and sensor 484 is formed from target 490 and conventional sensor 492. The other four position sensors, which measure axes 506 and 508, are shown in FIG. 14. Axis 502 is substantially the same axis as axis 506, while axis 504 is substantially the same as axis 508. In each instance, however, the second axis is longitudinally offset from the first axis a given distance along the surface of air carriage 444. Therefore, the two inputs from the same axis, in combination with the two inputs from the other axis, may be used to calculate pitch and yaw displacements. Sensor 490 is formed from target 520 and conventional sensor 522, and sensor 492 is formed from target 524 and conventional sensor 526. Sensor 494 is formed from target 528 and conventional sensor 530, and sensor 496 is formed from target 532 and conventional sensor 534.

FIG. 14 also shows null-flux sensor 452 in greater detail. As previously described, null-flux sensor 452 includes ferrite cup 232, ferrite cup 462 and four sense coils 454–460 (only 454 and 458 are shown in FIG. 14). Additionally, null-flux sensor 452 includes AC drive coil 536 and sensor coil 538 (sensor coil 538, which must be used in conjunction with sense coils 454–460, is also an optional sense coil that measures the vertical distance between ferrite cups 232 and 462). Null-flux sensor 452 provides measurement of both longitudinal and roll displacements. Longitudinal displacement is measured based upon the AC signals induced in sense coils 456 and 460. Roll displacement is determined based upon the AC signal induced in sense coils 454 and 458. Null-flux sensor 452 is powered by AC drive coil 536, which provides a relatively small current into ferrite cup 462.

Thus, magnetically levitated devices have been described in which relatively large loads may be levitated and transported back and forth along an axis in vacuum conditions with only a small consumption of power. Persons skilled in the art will appreciate that various other embodiments are possible based upon the principles of the present invention. For example, while the figures show a preferred embodiment in which a load is transported in a linear manner, the principles of the present invention may be used to produce angular movements and accelerations by replacing the linear table with angular table or similar device (and making minor adjustments to controller 4). Thus, it will be understood that the foregoing is only illustrative of the principles of the invention, and that various modifications can be made by those skilled in the art without departing from the scope and spirit of the invention.

We claim:

1. A magnetically levitated apparatus for transporting one or more workpieces, said apparatus comprising:
   a source of current;
   a control circuit;
   a mechanical drive system;
   a vacuum carriage having at least one supporting member for supporting said one or more workpieces and a plurality of permanent magnets;
   an air carriage having at least one permanent magnet that is aligned with at least one of said plurality of permanent magnets of said vacuum carriage to provide static levitation forces that support substantially all of the weight of said vacuum carriage, a plurality of Lorentz coils and a plurality of position sensors connected to said control circuit, each of said plurality of Lorentz coils being aligned with at least one of said plurality of permanent magnets such that said Lorentz coils are exposed to magnetic fields generated by said permanent magnets, said air carriage being coupled to said drive system such that said drive system transports said air carriage back and forth along an axis of transportation, said control circuit providing current to at least one of said Lorentz coils in response to said position sensors, said current generating Lorentz forces along a plurality of Lorentz force axes that levitate and magnetically link said vacuum carriage to said air carriage; and
   wherein one of said position sensors is a null-flux sensor that monitors displacement of said air carriage alone and about said an axis of transportation, said null-flux sensor comprising:
      a first ferrite cup mounted to said vacuum carriage;
      a second ferrite cup mounted to said air carriage;
      a plurality of sense coils mounted on said second ferrite cup between said first and second ferrite cups; and
      an AC drive coil mounted within said second ferrite cup.

2. The apparatus defined in claim 1, wherein said control circuit adjusts said alignment of said at least one air carriage permanent magnet and said vacuum carriage permanent magnets once said vacuum carriage is loaded down with said one or more workpieces to reduce power requirements of said apparatus.

3. The apparatus defined in claim 1, wherein said air carriage has two longitudinal sides and a top side, two of said plurality of Lorentz coils being configured on each longitudinal side to generate Lorentz forces perpendicular to said axis of transportation, at least one of said plurality of Lorentz coils being configured on each longitudinal side to generate Lorentz forces parallel to said axis of transportation, and at least one of said plurality of Lorentz coils being configured on said top side to generate Lorentz forces perpendicular to said axis of transportation.

4. The apparatus defined in claim 1, wherein each of said position sensors includes first and second Hall effect sensors, each of said position sensors being aligned with one of said plurality of Lorentz coils, said Hall effect sensors being configured about said aligned Lorentz coil such that said first and second Hall effect sensors are on an axis that is parallel to the Lorentz force axis of said aligned Lorentz force coil.

5. The apparatus defined in claim 1, wherein said remaining position sensors monitor displacement of said air carriage along at least two axes that are perpendicular to each other and are both perpendicular to said axis of transportation.

6. The apparatus defined in claim 5, wherein half of said remaining position sensors monitor displacement of said air carriage about a first pair of axes that are perpendicular to each other and to said axis of transportation and the other half of said remaining position sensors monitor displacement of said air carriage about a second pair of axes that are perpendicular to each other and to said axis of transportation, said first and second pair of axes being offset from each other a predetermined distance along said axis of transportation, and one axis of each of said first and second pair of axes being parallel to each other.

7. The apparatus defined in claim 1, wherein said plurality of sense coils include four sense coils configured such that said axis of transportation passes through the center of two of said four sense coils and an axis perpendicular to said axis of transportation passes through the other two of said four sense coils.

8. The apparatus defined in claim 1, wherein said null-flux sensor further comprises an additional sense coil mounted within said second ferrite cup, said additional sense coil monitoring vertical displacement between said first and second ferrite cups.

9. The apparatus defined in claim 1 further comprising a power transfer device that transfers power from said air carriage to said vacuum carriage, said power transfer device comprising:

a primary coil embedded within a ferrous material mounted to said air carriage; and a secondary coil embedded within a ferrous material mounted to said vacuum carriage, said primary and secondary coils forming a power transformer.

10. The apparatus defined in claim 9, wherein said vacuum carriage and said air carriage are separated by an air barrier such that said air carriage may be operated in an atmospheric environment at the same time that said vacuum carriage is operated in a vacuum environment, said air barrier being formed of substantially non-magnetic material, said primary and secondary coils being separated by said air barrier.

11. The apparatus defined in claim 1, wherein said vacuum carriage and said air carriage are separated by an air barrier such that said air carriage may be operated in an atmospheric environment at the same time that said vacuum carriage is operated in a vacuum environment, said air barrier being formed of substantially non-magnetic material.

12. The apparatus defined in claim 1, wherein said vacuum carriage is operated in a vacuum environment.

13. A magnetically levitated apparatus for transporting one or more workpieces, said apparatus comprising:

a source of current;

a control circuit;

a mechanical drive system;

a vacuum carriage having at least one supporting member for supporting said one or more workpieces and a plurality of permanent magnets;

an air carriage having at least one permanent magnet that is aligned with at least one of said plurality of permanent magnets of said vacuum carriage to provide static levitation forces that support substantially all of the weight of said vacuum carriage, a plurality of Lorentz coils and a plurality of position sensors connected to said control circuit, each of said plurality of Lorentz coils being aligned with at least one of said plurality of permanent magnets such that said Lorentz coils are exposed to magnetic fields generated by said permanent magnets, said air carriage being coupled to said drive system such that said drive system transports said air carriage back and forth along an axis of transportation, said control circuit providing current to at least one of said Lorentz coils in response to said position sensors, said current generating Lorentz forces along a plurality of Lorentz force axes that levitate and magnetically link said vacuum carriage to said air carriage; and a power transfer device that transfers Power from said air carriage to said vacuum carriage, said power transfer device comprising:

a primary coil embedded within a ferrous material mounted to said air carriage; and a secondary coil embedded within a ferrous material mounted to said vacuum carriage, said primary and secondary coils forming a power transformer.

14. The apparatus defined in claim 13, wherein said control circuit adjusts said alignment of said at least one air carriage permanent magnet and said vacuum carriage permanent magnets once said vacuum carriage is loaded down with said one or more workpieces to reduce power requirements of said apparatus.

15. The apparatus defined in claim 13, wherein said vacuum carriage and said air carriage are separated by an air barrier such that said air carriage may be operated in an atmospheric environment at the same time that said vacuum carriage is operated in a vacuum environment, said air barrier being formed of substantially non-magnetic material, said primary and secondary coils being separated by said air barrier.

* * * * *